United States Patent
Oppelt

(10) Patent No.: US 9,847,567 B2
(45) Date of Patent: Dec. 19, 2017

(54) DIRECTIONAL COUPLER

(71) Applicant: Ralph Oppelt, Uttenreuth (DE)

(72) Inventor: Ralph Oppelt, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 502 days.

(21) Appl. No.: 14/618,128

(22) Filed: Feb. 10, 2015

(65) Prior Publication Data

US 2015/0244054 A1    Aug. 27, 2015

(30) Foreign Application Priority Data

Feb. 24, 2014    (DE) .................. 10 2014 203 228

(51) Int. Cl.
*H01P 5/18*    (2006.01)
*H03H 7/38*    (2006.01)
(Continued)

(52) U.S. Cl.
CPC .......... *H01P 5/18* (2013.01); *G01R 33/34092* (2013.01); *G01R 33/36* (2013.01);
(Continued)

(58) Field of Classification Search
CPC ................. H01P 5/18; H01P 5/12; H03H 7/38
(Continued)

(56) References Cited

U.S. PATENT DOCUMENTS 4,945,321 A * 7/1990 Oppelt ..................... H03H 7/21
  333/119
5,537,080 A * 7/1996 Chawla ................. H03F 1/0233
  330/266

(Continued)

FOREIGN PATENT DOCUMENTS

DE    3811986 A1    10/1989
DE    3940252 A1    6/1991
(Continued)

OTHER PUBLICATIONS

German Office Action dated May 13, 2014 for corresponding German Patent Application No. DE 10 2014 203 228.8 with English translation.
(Continued)

*Primary Examiner* — Dean Takaoka
(74) *Attorney, Agent, or Firm* — Lempia Summerfield Katz LLC

(57) ABSTRACT

The embodiments relate to a directional coupler including, in each case, one connection for a first, a second, a third, and a fourth port. The coupler includes a first coupling network for providing the connection for the first port and a second coupling network for providing the connection for the second port. The first and second coupling networks are both connected to the connections for the third and fourth ports, wherein the second coupling network has a first inductance connected between the third port and an electrical reference potential, a first capacitance connected between the fourth port and the electrical reference potential, a second capacitance connected between the third port and the second port, and a second inductance connected between the fourth port and the second port.

19 Claims, 11 Drawing Sheets

(51) Int. Cl.
   *G01R 33/34* (2006.01)
   *G01R 33/36* (2006.01)
   *H01F 30/02* (2006.01)
   *H01F 38/14* (2006.01)
   *H03H 7/48* (2006.01)
   *H01F 38/02* (2006.01)

(52) U.S. Cl.
   CPC ........... *H01F 30/02* (2013.01); *H01F 38/023* (2013.01); *H01F 38/14* (2013.01); *H03H 7/38* (2013.01); *H03H 7/48* (2013.01); *H01F 2038/026* (2013.01); *H01F 2038/146* (2013.01)

(58) Field of Classification Search
   USPC .......................................... 333/109, 112, 116
   See application file for complete search history.

(56) References Cited

U.S. PATENT DOCUMENTS

| | | | | |
|---|---|---|---|---|
| 5,726,603 | A * | 3/1998 | Chawla | H03F 1/301 330/269 |
| 8,289,102 | B2 * | 10/2012 | Yamamoto | H01P 5/18 333/116 |
| 8,526,902 | B2 | 9/2013 | Biber et al. | |
| 9,035,717 | B2 * | 5/2015 | Tanaka | H03H 7/42 333/109 |
| 9,385,411 | B2 * | 7/2016 | Ohashi | H01P 5/187 |
| 9,391,354 | B2 * | 7/2016 | Ootsuka | H01P 5/185 |
| 9,413,324 | B2 * | 8/2016 | Tanaka | H03H 7/0115 |
| 2013/0063221 | A1 | 3/2013 | Biber et al. | |
| 2015/0042412 | A1 * | 2/2015 | Imbornone | H01P 5/18 333/112 |
| 2015/0263406 | A1 * | 9/2015 | Ohashi | H01P 5/187 333/110 |

FOREIGN PATENT DOCUMENTS

| | | |
|---|---|---|
| DE | 19522673 A1 | 1/1997 |
| DE | 102011005349 A1 | 9/2012 |

OTHER PUBLICATIONS

F.W. Gundlach, "Taschenbuch der Hochfrequenztechnik," vol. 4, pp. 1-2, Springer-Verlag, 1968.
K. Steinbuch, et al., "Nachrichtentechnik", Springer-Verlag, pp. 239 to 244, 1967.
W. Hayward (W7ZOI), "Radio Frequency Design," published American Radio Wiley League, ISBN 0-87259-492-0, pp. 1-5.
U. Fleischmann, "Transformierende Hoch- and Tiefpässe vierter Ordnung," Elektronikrundschau, No. 6, pp. 26-35, 1981.

* cited by examiner

DIRECTIONAL COUPLER

CROSS-REFERENCE TO RELATED APPLICATIONS

This application claims the benefit of DE 10 2014 203 228.8, filed on Feb. 24, 2014, which is hereby incorporated by reference in its entirety.

TECHNICAL FIELD

The present embodiments relate to a directional coupler having in each case one connection for a first, a second, a third, and a fourth port. Furthermore, the embodiments also relate to a magnetic resonance tomography device including electrical transmission coils arranged in a housing providing a ring-shaped space and a radiofrequency generator, which applies radiofrequency electric power to the electrical transmission coils, and also includes reception coils.

BACKGROUND

A directional coupler is in principle a reciprocal, loss-free four-port structure, in which each port is decoupled from one of the three other ports. Directional couplers, and the design and use of said directional couplers are described, inter alia, in "Taschenbuch der Hochfrequenztechnik" ["Pocketbook of radiofrequency engineering"], 4th edition, 1986, Springer-Verlag. The directional coupler may be formed by discrete components. Furthermore, the directional coupler may also have, at least partially, line sections instead of discrete components. The directional coupler is in principle a component part in radiofrequency engineering and is used, inter alia, to branch off from a waveguide or a line some of the energy from the electromagnetic waves guided therein in directionally dependent fashion. The technical design is dependent, in particular, on the frequency of the electromagnetic waves applied to the directional coupler.

One application area for directional couplers is in signal monitoring and/or matching monitoring of transmitters and in the measurement of a standing wave ratio, for example. By a directional coupler, signals based on electromagnetic waves may be coupled out of the waveguide separately according to their propagation direction. An important application area for directional couplers is magnetic resonance tomography devices. In this case, the directional couplers are used for distributing and measuring radiofrequency electromagnetic waves. Directional couplers are made to specification in small numbers, in particular, in the high-power range, and are therefore correspondingly complex to manufacture. The directional couplers require a large amount of installation space for high powers and are therefore expensive.

In principle, the directional coupler has four ports, to which lines or further functional modules may be connected. An important property of a directional coupler is that an electromagnetic wave, which is supplied at one of its ports, splits with a defined ratio at two functionally opposite ports and is not coupled out at the further port on the feed-in side. This property applies, in principle, to any port of the directional coupler.

Directional couplers whose four ports are coupled by a transformer that has three windings are known. The use of the transformer has the disadvantage that, in this case, not always the same characteristic impedance is available at the ports of the directional coupler. In the case of radiofrequency circuits, this is desirable, however. Although the characteristic impedance may be matched by matching of the transformation ratio of the windings with respect to one another, such a winding may not be wound in trifilar fashion, which results in further problems, in particular, in respect of the coupling factor. Furthermore, a problem with respect to the value of the characteristic impedance remains at one or more of the ports. Correspondingly, circuitry complexity is provided in order to be able to match the characteristic impedance by supplementary matching networks, e.g., such that all four ports have the same characteristic impedance.

Furthermore, it is known to form the abovementioned transformer by two line transformers in order to be able to transmit in particular high frequencies with low losses and with a particularly wide bandwidth. However, the problem of non-uniform characteristic impedances at the four ports remains in this case too.

Furthermore, special directional couplers, namely ring couplers, (also referred to as rat race couplers), are known. The couplers have a particularly narrow bandwidth, wherein individual line segments may be formed by lines of discrete elements. For such a ring coupler, at least 10 elements are required, namely at least four inductances and six capacitances.

SUMMARY AND DESCRIPTION

The scope of the present invention is defined solely by the appended claims and is not affected to any degree by the statements within this summary. The present embodiments may obviate one or more of the drawbacks or limitations in the related art.

The embodiments are based on the object of developing a directional coupler of the generic type and a magnetic resonance tomography device of the generic type such that they may be realized with little complexity and/or have improved technical properties.

In particular, a directional coupler includes in each case one connection for a first, a second, a third and a fourth port, including a first coupling network for providing the connection for the first port and a second coupling network for providing the connection for the second port, which coupling networks are both connected to the connections for the third and fourth ports, wherein the second coupling network includes (1) a first inductance, which is connected between the third port and an electrical reference potential, (2) a first capacitance, which is connected between the fourth port and the electrical reference potential, (3) a second capacitance, which is connected between the third port and the second port, and (4) a second inductance, which is connected between the fourth port and the second port.

This configuration makes it possible to avoid the complex transformer having three windings, in contrast to a directional coupler of the generic type. Owing to the use of the second coupling network, the transformer winding required in the case of the directional coupler according to the generic type for providing the connection for the second port may be dispensed with. At the same time, the second coupling network makes it possible to adjust the characteristic impedance to the desired value, in particular so as to match it to the characteristic impedances of the two other ports to which the coupling network is connected. As a result, the procurement and design of the directional coupler may be improved. The complex transformer having three windings may be avoided. Furthermore, a directional coupler that requires fewer components and may be used with a wider bandwidth, in comparison with the ring coupler or the rat race coupler, may be provided. Finally, the characteristic impedance of the four ports of the directional coupler may be substantially identical.

Furthermore, in certain embodiments, a magnetic resonance tomography device is provided, the device including electrical transmission coils arranged in a housing providing a ring-shaped space and a radiofrequency generator applying radiofrequency electric power to the electrical transmission coils and including reception coils. The magnetic resonance tomography device also includes a directional coupler. It is thus possible to configure the magnetic resonance tomography device overall to be more cost-effective and compact. Owing to the use of the advantages of the directional coupler, the magnetic resonance tomography device may thus be improved overall. The ring-shaped space may be round and/or angular along its ring-shaped extent. Furthermore, the ring-shaped space may have, for example, a substantially angular, in particular rectangular or else round cross section, such as, for example, a torus or the like. The transmission coils may be arranged in the ring-shaped space of the housing. The reception coils may likewise be arranged in the ring-shaped housing. However, the reception coils may alternatively also be arranged outside the ring-shaped housing, for example, adjacent to the housing or else on a patient who is positioned within a through-opening provided through the housing.

In principle, any substantially loss-free passive linear four-terminal network according to a law on four-terminal theory for a frequency may be described as a ladder network of a line and a transformer. To this extent, a directional coupler that is constructed from discrete components, such as, for example, inductances, capacitances, and/or the like, may also be formed at least partially by corresponding lines or line sections. In particular, the directional coupler may be formed completely from line sections. Directional couplers are often referred to as "hybrid" when power splitting of −3 dB in the case of the ports providing the power is realized.

If the directional coupler is formed with discrete components, the inductances may be in the form of an electrical coil, in particular, an air-core coil or the like. The capacitances may be formed by capacitors, for example, in the form of glass or ceramic capacitors, but also in the form of film capacitors and/or the like. In the case of a design with discrete components, provision may be made for the components to be arranged at least partially on a printed circuit board in the form of an electronic assembly. This assembly may also be provided with line sections, which line sections may replace dually assigned inductances and capacitances. Furthermore, the design may also be such that it is at least partially unsupported, e.g., without a printed circuit board or the like. The choice of design is dependent in particular also on the frequency range in which the directional coupler is intended to be operated. If the directional coupler is intended for use in a magnetic resonance tomography device, frequencies in a range of from 10 MHz to 300 MHz, (e.g., 64 MHz), may be used in the case of hydrogen, for example. The field intensity provided by an electrical basic field coil of the magnetic resonance tomography device may be, for example, in the range of from 1.5 Tesla (T) to 3 T. The basic field coil generates a substantially constant and very homogeneous magnetic field, which is also referred to as basic field. The frequencies intended for use in magnetic resonance tomography devices may vary, for example, when measuring phosphorus instead of hydrogen.

In accordance with an advantageous development, the directional coupler is designed such that, when an input signal is fed in at the connection for the first or the second port, the directional coupler does not provide an output signal at the respective other connection for the first or the second port but provides output signals at the connections for the third and fourth ports in such a way that these output signals are shifted through 0° or 180° with respect to one another in terms of their relative phase angle. Additionally, when an input signal is fed in at the connection for the third or the fourth port, the directional coupler does not provide an output signal at the respective other connection for the third or the fourth port but provides output signals at the connections for the first and second ports in such a way that these output signals are shifted through 0° or 180° with respect to one another in terms of their relative phase angle. In this configuration, the directional coupler therefore serves the purpose of dividing the supplied power into two powers, (e.g., identical powers). In this case, however, the radiofrequency oscillations generated at the two ports, which each provide half the power, are phase-shifted through 0° or 180°.

In accordance with a further configuration, the first and second coupling networks are connected in parallel to the connections for the third and fourth ports. This configuration makes it possible to further reduce the number of component parts by virtue of, for example, selected functions being realized by the parallel circuit by common component parts.

A further configuration provides that the first coupling network has an autotransformer, which is connected to the connections for the third and fourth ports and has a center connection, which provides the connection for the first port via a matching network. As a result, effective coupling of the inductances of the autotransformer with one another may be achieved. At the same time, a transformer with a complex configuration and having three windings is no longer required. The matching network may be provided for transforming the impedance or the characteristic impedance of the center connection into the impedance or characteristic impedance desired for the first port. For this purpose, the matching network may have, for example, a matching inductance between the connection for the first port and the center connection of the autotransformer and a matching capacitance between the connection for the first port and the reference potential. Alternatively, the matching network may have a matching capacitance, which is connected between the connection for the first port and the center connection of the autotransformer, and a matching inductance between the connection for the first port and the reference potential. As a result, matching may also be achieved for the case in which matching may not be achieved by the matching network described formerly. Matching may be performed by the first-mentioned matching network. The matching networks differ in respect of their transmission far away from the fundamental frequency. If it were desired to damp higher frequencies, the first-described matching network would be advantageous, whereas, if it were desired to damp frequencies below the fundamental frequency, the alternatively described matching network would be advantageous.

The matching network may also be realized at least partially by line sections. The autotransformer has, in contrast to conventional transformers, only a single coil having a winding that has one or more taps. In this case, only a single tap providing the center connection is provided such that there is a symmetry with respect to the center connection, for example, by virtue of the center connection being connected with half the turns number of the winding.

The reference potential may be, for example, a circuit ground or else another suitable electrical reference potential.

Furthermore, the embodiments propose that the first coupling network has two capacitances, which are connected between the reference potential and in each case one of the third and fourth ports, two inductances, which are connected between the first port and in each case one of the third and fourth ports, and a capacitance, which is connected between the first port and the reference potential. This configuration has proved favorable, in particular, in the parallel circuit with the second coupling network since savings may additionally be made in respect of components in this case, (e.g., when the first and second coupling networks are connected in parallel). Furthermore, it is possible with this configuration to completely avoid the transformer. This reduces costs and complexity for the directional coupler.

In accordance with a further configuration, the first coupling network, the second coupling network and/or parts thereof have a multi-stage design. As a result, a bandwidth and an impedance transformation may be further improved. Thus, for example, provision may be made for the second coupling network to be equipped with a second stage such that the circuit is interrupted at the connection for the second port and first and second inductances. Additionally, the capacitances, interconnected as explained at the outset, are connected again to the two new connections thus formed, wherein the supplemented circuit part now provides the connection for the second port. Correspondingly, a second stage for a first coupling network may be achieved. These configurations may also be combined with one another as desired, or optionally supplemented by further stages, depending on the technical requirement.

It has proven to be particularly advantageous if the directional coupler is in the form of a 180° hybrid. As a result, it may be produced reproducibly in a simple manner and with a low level of installation complexity being involved. In one example, the 180° hybrid consists exclusively of line sections that are connected to one another dually as discrete components.

DETAILED DESCRIPTION

If, for example, in the case of a 180° hybrid, a radiofrequency signal is fed into any one of its ports, the power of this radiofrequency signal is distributed among two output ports, (e.g., with approximately the same magnitude). There may be substantially no power available at the third port, for which reason the third port is also referred to as decoupled port in this case. In the case of a 180° hybrid, the phase difference between the signals at the output ports at which half the power is provided is either 0° or 180°. Besides this, there are also 90° hybrids in which the corresponding phase difference is then 0° or 90°.

The signal behavior of a hybrid, in particular of a 180° hybrid, may be characterized by the scattering matrix specified below, occasionally also referred to as S-matrix. In contrast to an ideal scattering matrix in which the phases between input and output ports are also strictly defined, in practice often only the phase difference between the two ports at which in particular half the output power is made available is relevant. An additional group propagation time from the port at which the power is supplied up to one or both of the output ports is often not relevant, however.

$$S = \frac{1}{\sqrt{2}} \begin{pmatrix} 0 & 0 & 1 & 1 \\ 0 & 0 & -1 & 1 \\ 1 & -1 & 0 & 0 \\ 1 & 1 & 0 & 0 \end{pmatrix}$$

Hybrids are often used in radiofrequency engineering for combining radiofrequency signals, in particular, radiofrequency signals of identical strength and radiofrequency signals that are in phase or in phase opposition. If, for example, a radiofrequency power is fed into in each case mutually decoupled ports of the directional coupler or hybrid, for example, reactions from the sources providing the radiofrequency signals may be avoided. Similarly, this also applies to the division of a radiofrequency signal into two partial signals.

The abovementioned scattering matrix is that for an ideal reflectivity-free 180° hybrid in the form of a four-port network. It describes the relationship between the electromagnetic waves entering and leaving at the four ports of the 180° hybrid.

Figure 1:
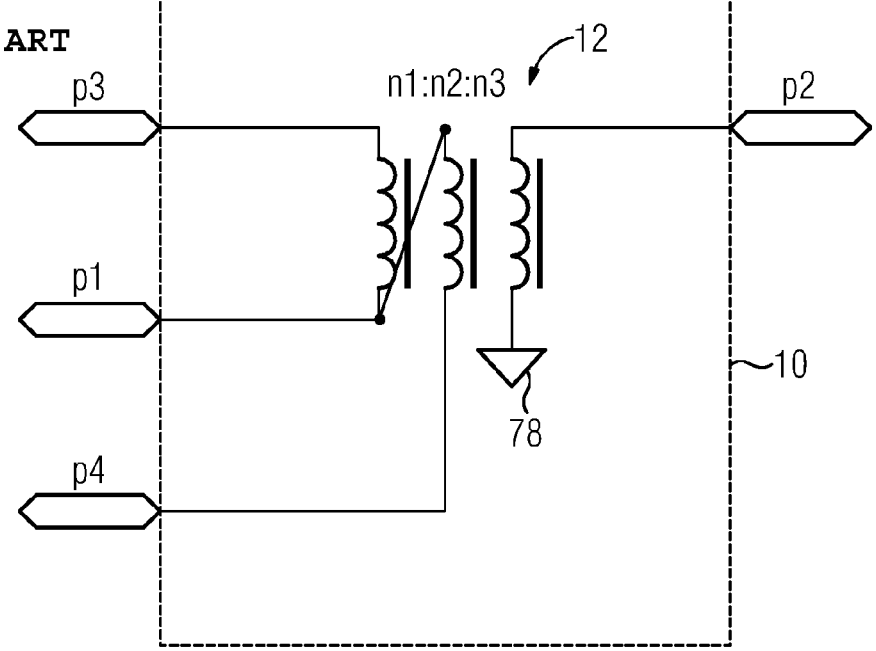
FIG. 1 depicts a schematic basic circuit diagram of a directional coupler of the prior art including a transformer having three windings.

FIG. 1 depicts a schematic illustration of a circuit diagram of a directional coupler in accordance with the prior art including a transformer having three windings. Such a transformer is also known from the field of hybrid circuits in electromechanical telephones as differential transformers. In this case, the purpose was to suppress the possibility of hearing oneself as one speaks by virtue of the telephone receiver being connected to that port of the hybrid circuit that is decoupled from the microphone of the telephone. A representation of the hybrid circuit is given, for example, in K. Steinbuch, W. Rupprecht: "Nachrichtentechnik" [Telecommunications engineering], Springer-Verlag 1967, pages 239 to 244.

In FIG. 1, the directional coupler 10 has four ports P1, P2, P3, P4, which are connected to the transformer 12. Although the configuration of the directional coupler 10 illustrated in FIG. 1 has good bandwidth properties, at the same time the directional coupler 10 does also have technical disadvantages. In practice, a preset characteristic impedance may be desired at the ports of the directional coupler, which characteristic impedance may be the same at each port of the directional coupler. For example, such a characteristic impedance is 50Ω. In the case of the arrangement depicted in FIG. 1, however, this may not be realized. If the ports P3 and P4 of the directional coupler 10 are designed for a characteristic impedance of 50Ω, the characteristic impedance is necessarily rated to 25Ω at port P1. If, therefore, the characteristic impedance $Z_0$ at the ports P3 and P4 is defined, the value $Z_0/2$ results at port P1.

Furthermore, it is desirable in the case of the circuit depicted in FIG. 1 if the transformer 12 has a transformation ratio for its three windings of 1:1:1. This may be produced inexpensively as a trifilar structure with good coupling. Such a transformer then has a characteristic impedance of $2Z_0$ at port P2, however, and in the case of $Z_0=50Ω$, the characteristic impedance at port P2 is therefore 100Ω. If it is desirable to reach a characteristic impedance of 50Ω at port P2 as well, the transformation ratio would have to be changed to N1:N2:N3=1:1:√2. Such a transformation ratio may no longer be wound in trifilar fashion and furthermore results in a poorer coupling factor. Trifilar winding provides that the electrical conductors of all of the windings are twisted with one another or wound next to one another. Furthermore, the problem of the deviating characteristic impedance remains at port P1. This may in any case be eliminated by a further transformer with a transformation ratio of, for example, √2:1, with which the characteristic impedance may be transformed from 25Ω to 50Ω. It may be seen from the transformation ratio that this transformer also may not be wound in bifilar fashion, which results in further disadvantages.

Overall, a directional coupler as depicted in FIG. 1 has proven to be complex to manufacture and difficult to procure, in particular, when high radiofrequency powers need to be converted, such as in the case of magnetic resonance tomography devices, for example. Further problems may result from the fact that a ferromagnetic core, for example, a ferrite or the like, is often used for providing favorable coupling between the windings of the transformer. In the case of such a use, however, in particular the nonlinearity of the core results in undesired measured value deviations. In particular, such effects occur when the core is operated in the region of saturation. Therefore, operation of such a transformer close to the basic field coil of a magnetic resonance tomography device is impossible since already the parasitic field of the basic field coil effects saturation.

Figure 2:
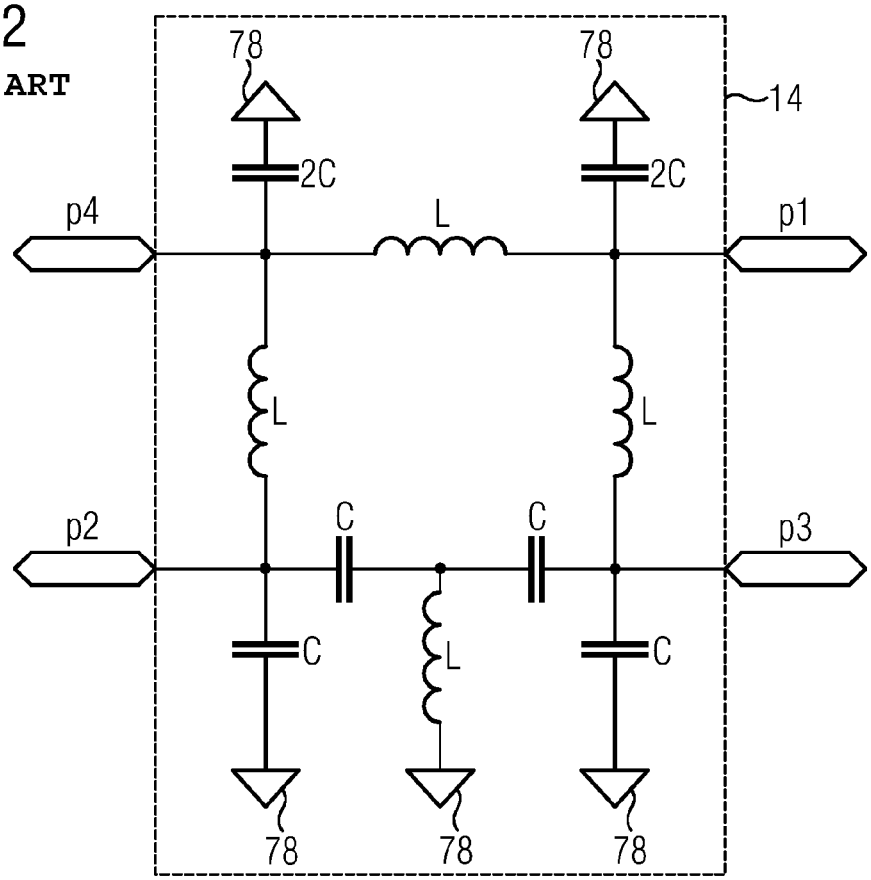
FIG. 2 depicts a ring coupler constructed discretely as a rat race coupler as prior art, in which all of the ports have the same impedance.

Furthermore, 180° hybrids are known as directional couplers in radiofrequency engineering that have a line structure and are referred to as ring couplers or rat race couplers. Such directional couplers have a very narrow bandwidth. A schematic circuit diagram of such a ring coupler 14 is illustrated in FIG. 2. The individual line segments may be formed by lines of discrete elements, such as is illustrated, for example, in FIG. 2. FIG. 2 depicts a directional coupler 14 from the prior art, which is implemented as a discrete rat race coupler. The directional coupler 14 again has the four ports P1 to P4, as also in the case of the directional coupler depicted in FIG. 1. In this case, the directional coupler is formed from inductances L and capacitances C or 2C. In this case, the capacitance 2C is twice the value of the capacitance C. For a frequency of the radiofrequency signal of 10 MHz and a characteristic impedance of $Z_0$ of 50Ω, a value of 1.125 μH for the inductance L and a value of 225.1 pF for the capacitance C result for the directional coupler 14.

Figure 3:
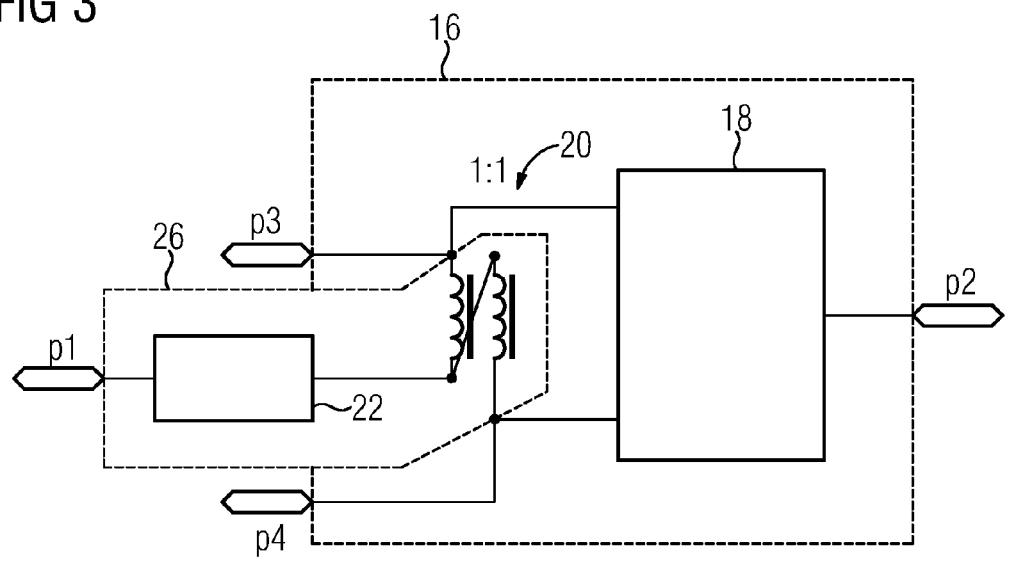
FIG. 3 depicts a schematic block circuit diagram of a first exemplary embodiment of a directional coupler including a Boucherot network and a transformer having two windings with a matching network.

FIG. 3 depicts a schematic block circuit diagram of a first configuration for a 180° hybrid as directional coupler 16. The directional coupler 16 depicted in FIG. 3 includes a first coupling network 26 for providing the connection for the first port P1 and a second coupling network 18 for providing the connection for the second port P2. The first coupling network 26 and the second coupling network 18 are connected to the connections for the third and fourth ports P3, P4. The first coupling network 26 in this configuration has an autotransformer 20 having a center connection. The autotransformer 20 is connected to the connections for the third and fourth ports P3, P4 of the 180° hybrid. The center connection of the autotransformer 20 provides, via a matching network 22, the connection for the first port P1.

Figure 4:
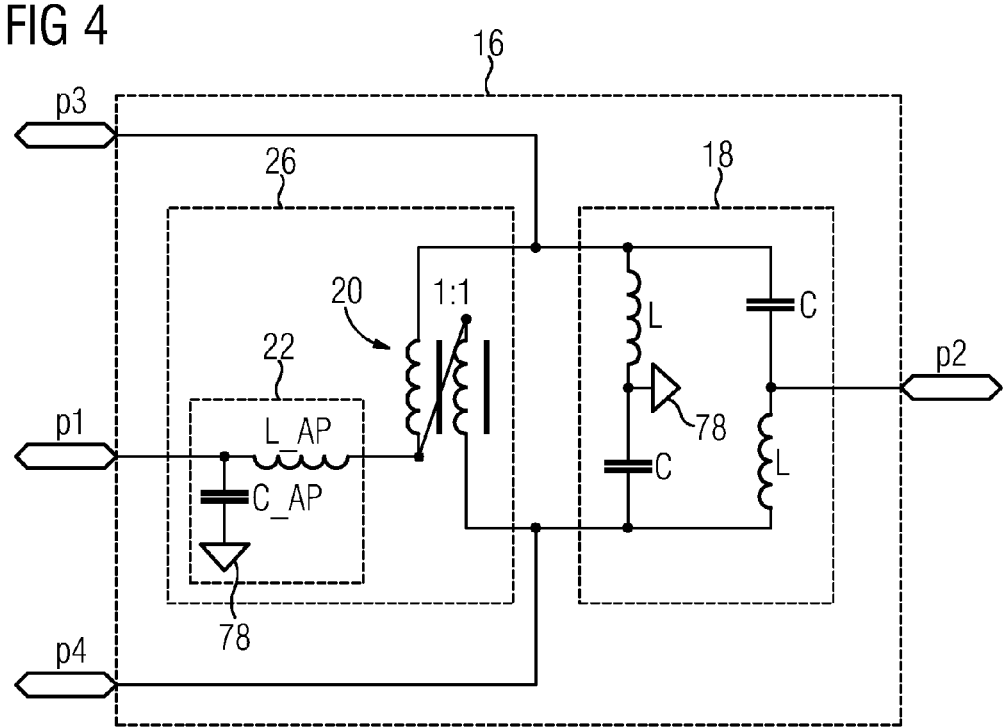
FIG. 4 depicts a more specific schematic illustration of the directional coupler depicted in FIG. 3 with discrete electronic component parts.

FIG. 4 depicts a more specific form of the embodiment depicted in FIG. 3 in a schematic illustration of a circuit diagram. The first coupling network 26 in this case includes the autotransformer 20, as described above. In this configuration, the matching network 22 has a matching inductance L_AP and a matching capacitance C_AP. The matching inductance L_AP is connected with one of its two connections to the center connection of the autotransformer 20 and with another of its two connections to the connection for the first port P1. The matching capacitance C_AP is connected between a reference potential 78 and the connection of the first port P1. The reference potential 78 is defined here by a circuit ground. The matching network 22 is occasionally also referred to as gamma match. In an alternative embodiment, provision may also be made for a matching capacitance to be connected instead of the matching inductance L_AP and at the same time for a matching inductance to be connected instead of the matching capacitance C_AP, in dual fashion. The calculation of the values for the matching capacitance and the matching inductance is performed in this case correspondingly in a manner deviating from the calculation of the matching inductance L_AP and the matching capacitance C_AP.

The first coupling network 26 and the second coupling network 18 are connected in parallel and are connected to the connections for the third and fourth ports P3, P4.

The second coupling network 18 includes (1) a first inductance L, which is connected between the third port P3 and the electrical reference potential 78, (2) a first capacitance C, which is connected between the fourth port P4 and the electrical reference potential 78, (3) a second capacitance C, which is connected between the third port P3 and the second port P2, and (4) a second inductance L, which is connected between the fourth port P4 and the second port P2. The second coupling network 18 is therefore based on a circuit for a Boucherot network.

A dimensioning specification for the component parts of the second coupling network 18 may be gleaned from DE 20 2011 005 349 A1, for example. A dimensioning specification for the matching network 22 may be gleaned, for example, from W. Hayward (W7ZOI): "Radio Frequency Design", published by American Radio Wiley League, ISBN 0-87259-492-0. At an operating frequency of 10 MHz and a characteristic impedance of 50Ω, the following values then result, for example: L=1.125 μH, C=225.1 pF, L_AP=397.9 nH and C_AP=318.3 pF.

Care may be taken here to provide that $2Z_0$ is selected in the calculation for the symmetrical side of the second coupling network, to be precise the sum of the impedance terminations at the ports P3 and P4. In principle, at in particular relatively high operating frequencies, at least some of the discrete components of the 180° hybrid depicted in FIG. 4 may also be replaced by line sections. With respect to the dual analogy, reference is made to the literature reference specified in the introductory part of the description.

Figure 5:
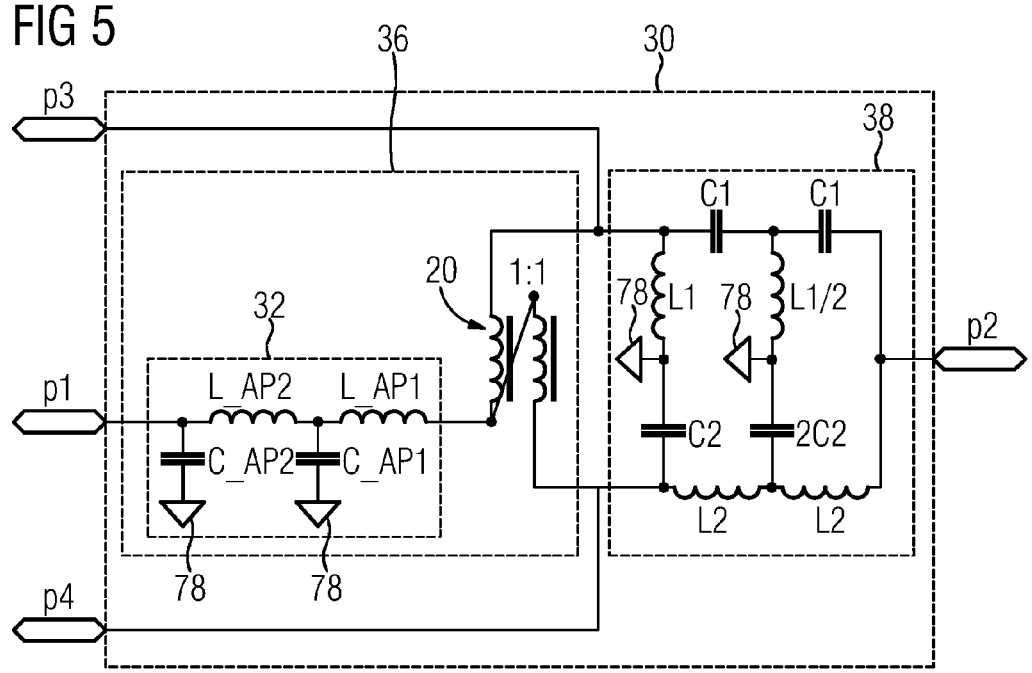
FIG. 5 depicts a schematic illustration of a further configuration of a directional coupler on the basis of the configuration depicted in FIG. 4, but with a two-stage matching network and a two-stage Boucherot network.

FIG. 5 depicts a further configuration that is based on the exemplary embodiment depicted in FIGS. 3 and 4. In contrast to the exemplary embodiment depicted in FIGS. 3 and 4, in the exemplary embodiment depicted in FIG. 5, the first and second coupling networks 36, 38 have a two-stage design. As in the preceding exemplary embodiment, the two coupling networks 36, 38 are connected, again connected in parallel, to the connections for the third and fourth ports P3, P4 of a directional coupler 30. The first coupling network 36 differs from the first coupling network 26 in accordance with the preceding exemplary embodiment in that the matching network 32 has a two-stage design, in contrast to the matching network 22 from the preceding exemplary embodiment. For this purpose, a second matching network 22 is additionally connected in between the connection for the first port P1 and the matching network 22 with reference to the preceding exemplary embodiment, with the result that, overall, the matching network 32 results. The autotransformer 20 is again designed as in the preceding exemplary embodiments. The two-stage matching network 32 may be dimensioned, for example, with the aid of U. Fleischmann: "Transformierende Hoch- and Tiefpasse vierter Ordnung" [Transforming high-pass and low-pass filters of the fourth order], Elektronikrundschau, volume 6, 1981, pages 26 to 35. In this configuration, the two-stage matching network 32 includes a first matching inductance L_AP1, which is connected to the center connection of the autotransformer 20 and to which, in turn, both a first matching capacitance C_AP1 and a second matching inductance L_AP2 are connected. Via the matching inductance L_AP2, the port P1 at which a second matching capacitance C_AP2 is connected is provided. Both matching capacitances C_AP1 and C_AP2 are additionally connected to the reference potential 78.

Likewise, the second coupling network 38 has a two-stage design in contrast to the second coupling network 18 from the preceding exemplary embodiment with reference to FIGS. 3 and 4. The difference consists, inter alia, in that the second coupling network 18 is interrupted in FIG. 4 at the connection for the port P2 and a duplicated further second coupling network 18 is additionally connected to the two new connections formed hereby and in this way forms the second coupling network 38. The further second coupling network 18 provides the connection for the second port P2. The component parts forming the second coupling network 38 need to be calculated correspondingly in a manner deviating from that for the component parts of the second coupling network 18.

Additional deviations with respect to the preceding exemplary embodiment result from the fact that the values for the inductances and for the capacitances do not all need to be the same in this case too.

Figure 6:
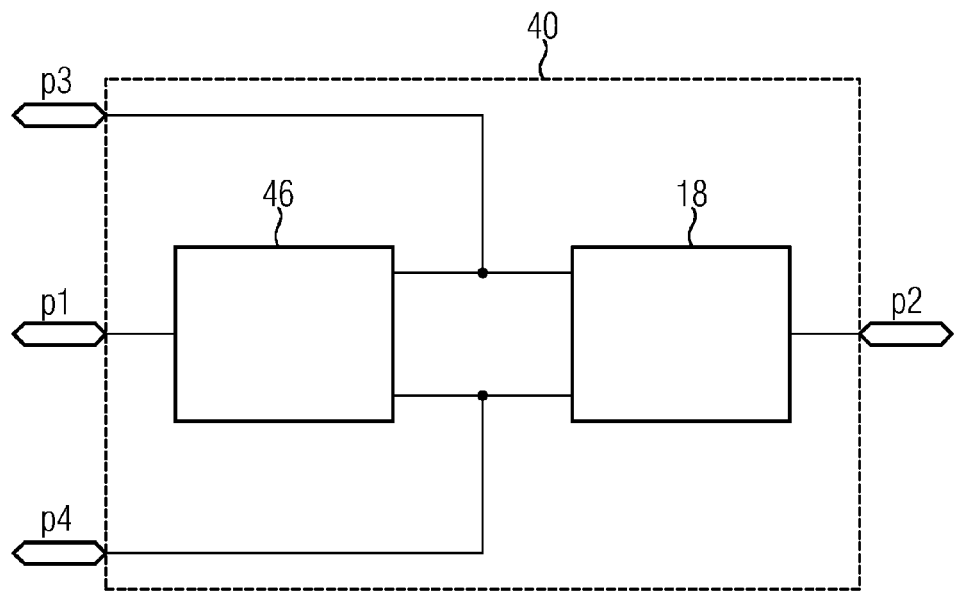
FIG. 6 depicts a schematic circuit diagram of a further configuration of a directional coupler based on FIG. 3 with a combination of a Wilkinson divider and a Boucherot network.

FIG. 6 depicts an illustration of a block circuit diagram of a further directional coupler 40 including a circuit principle based on that in FIG. 3. The illustration of the block circuit diagram depicted in FIG. 6 depicts that a directional coupler 40, in this case also a 180° hybrid, has a first coupling network 46 instead of the coupling networks 26 and 36 provided in the preceding exemplary embodiments. This coupling network is connected in parallel with a second coupling network 18, as has already been described in the preceding exemplary embodiments. The parallel circuit including the first and second coupling networks 18, 46 is connected to the connection terminals for the third and fourth ports P3, P4 of the 180° hybrid. As in the preceding exemplary embodiments, the second coupling network 18 provides the connection for the second port P2. Correspondingly, the first coupling network 46 provides the connection for the first port P1.

In contrast to the preceding exemplary embodiments, in this configuration a transformer such as the autotransformer 20 is no longer required. The second coupling network 18 may again be in the form of a Boucherot network.

Figure 7:
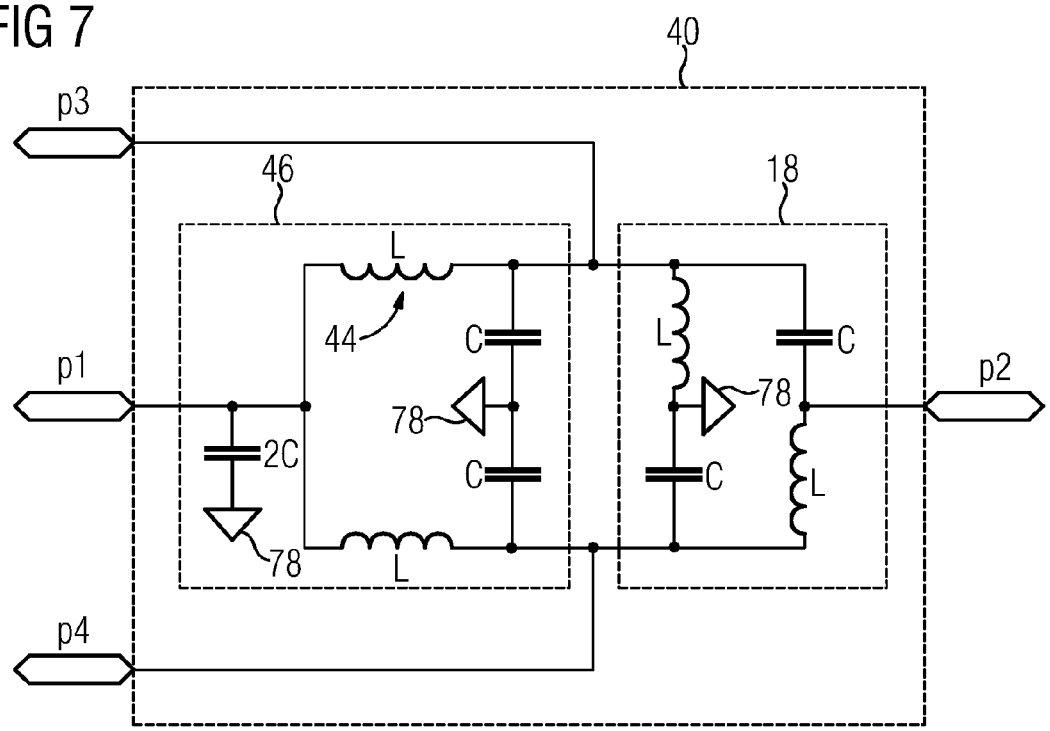
FIG. 7 depicts a schematic circuit diagram of a more specific configuration depicted in FIG. 6 with discrete electronic component parts.

FIG. 7 depicts a more specific illustration of this exemplary embodiment depicted in FIG. 6. It may be seen that the second coupling network 18 is designed in the same way as the coupling network 18 depicted in FIG. 4. In this regard, therefore, reference is made to the corresponding details given in respect of the coupling network 18.

The first coupling network 46 includes two capacitances C, which are connected between the reference potential 78 and in each case one of the third and fourth ports P3, P4, two inductances L, which are connected between the first port P1 and in each case one of the third and fourth ports P3, P4, and a capacitance 2C, which is connected between the first port P1 and the reference potential 78. The capacitance 2C has twice the capacitance value of the other capacitances C. In alternative configurations, this capacitance may also be formed by the component part connected to the connection of the first port P1 and/or the line connected thereto.

The first coupling network 46 is based on the circuit principle of the Wilkinson divider, as is used in radiofrequency engineering. As a result, the autotransformer 20 and also the matching network 22 or 32 required for this from the preceding exemplary embodiments become obsolete. In contrast to the Wilkinson divider, the decoupling impedance provided there of the order of $2Z_0$ is not required in this exemplary embodiment because this is realized by the second coupling network 18 terminated at port P2, in this case the Boucherot network, with a termination connected to port P2. To this extent, the coupling network 46 differs from the Wilkinson divider in respect of the circuit structure.

For an operating frequency of 10 MHz and a characteristic impedance $Z_0$ of 50Ω, the following values result: L=1.125 μH and C=225 pF.

Figure 8:
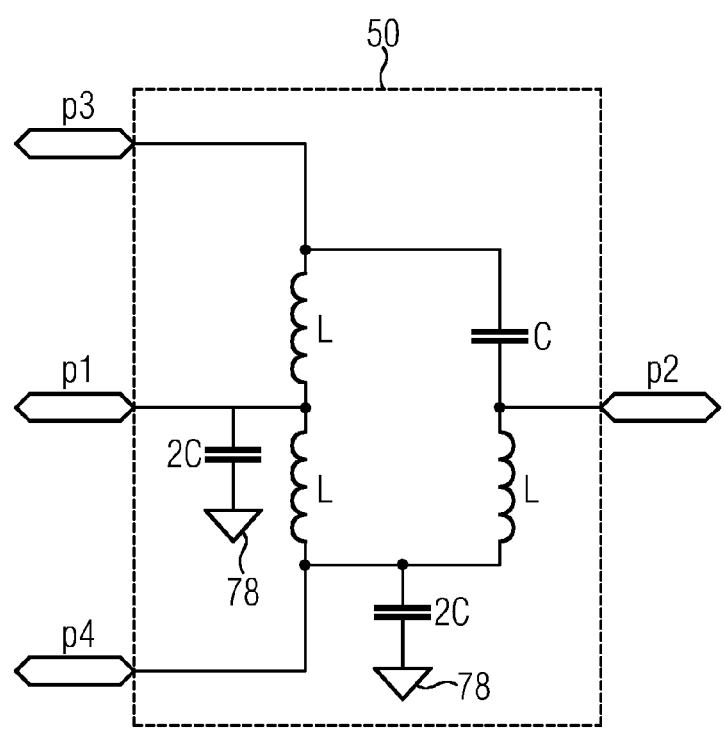
FIG. 8 depicts a schematic circuit diagram of a simplified configuration of a directional coupler as depicted in FIG. 7.

FIG. 7 further depicts that two capacitances C are connected in parallel. Furthermore, the further capacitance C and inductance L may also form a parallel resonant circuit. This is resonant in the band center. The economy version that manages with only six components, as illustrated in FIG. 8, may be derived from this. In comparison with the rat race coupler, as is illustrated in FIG. 2, markedly fewer component parts are therefore required. Correspondingly, FIG. 8 depicts a basic circuit diagram of a correspondingly reduced directional coupler 50.

For applications with a wider bandwidth, both multi-stage first and/or second coupling networks may be used. In particular, the Wilkinson divider may also have a multi-stage design.

Figure 9:
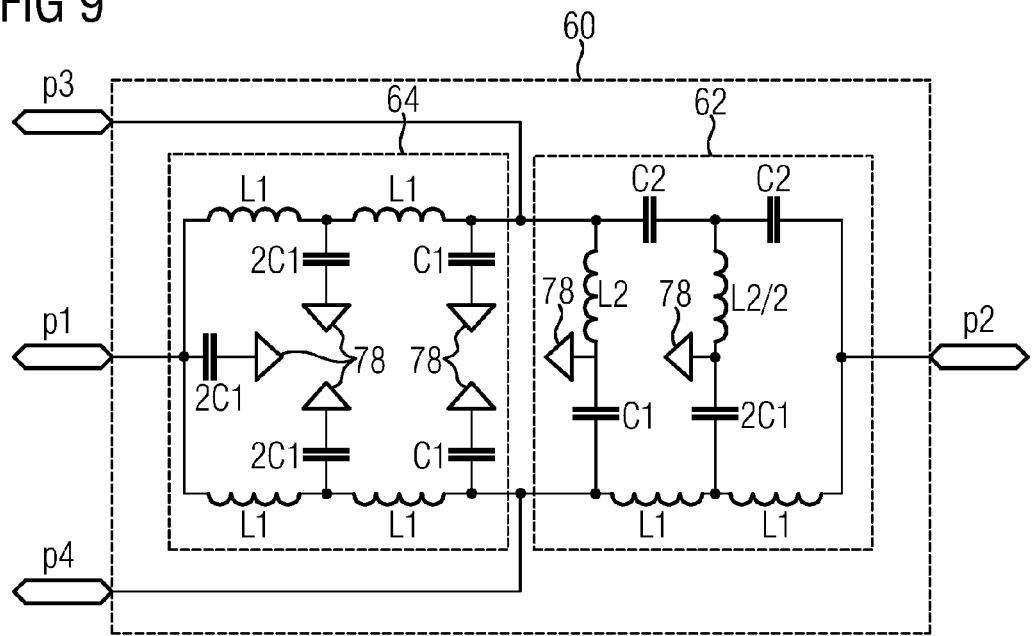
FIG. 9 depicts a schematic circuit diagram of a further configuration of a directional coupler on the basis of the configuration depicted in FIGS. 6 and 7, wherein both the Wilkinson divider and the Boucherot network each have a two-stage design.

Correspondingly, FIG. 9 depicts a basic circuit diagram of a further directional coupler 60, which has both a first two-stage coupling network 64 based on the Wilkinson divider and a two-stage coupling network 62 based on the Boucherot network. The two discrete 90° lines of the first coupling network 64, the Wilkinson divider, are replaced by two cascaded 45° lines. In this way, the first coupling network 64 is produced, which is connected in parallel with the second coupling network 62 and is connected to the connections for the third port and fourth port P3, P4 of the directional coupler 60.

The first coupling network 64 also at the same time provides the connection for the first port P1. Correspondingly, the second coupling network 62 provides the connection for the second port P2. With respect to the dimensioning, reference is made to the details provided in respect of the preceding examples.

Figure 10:
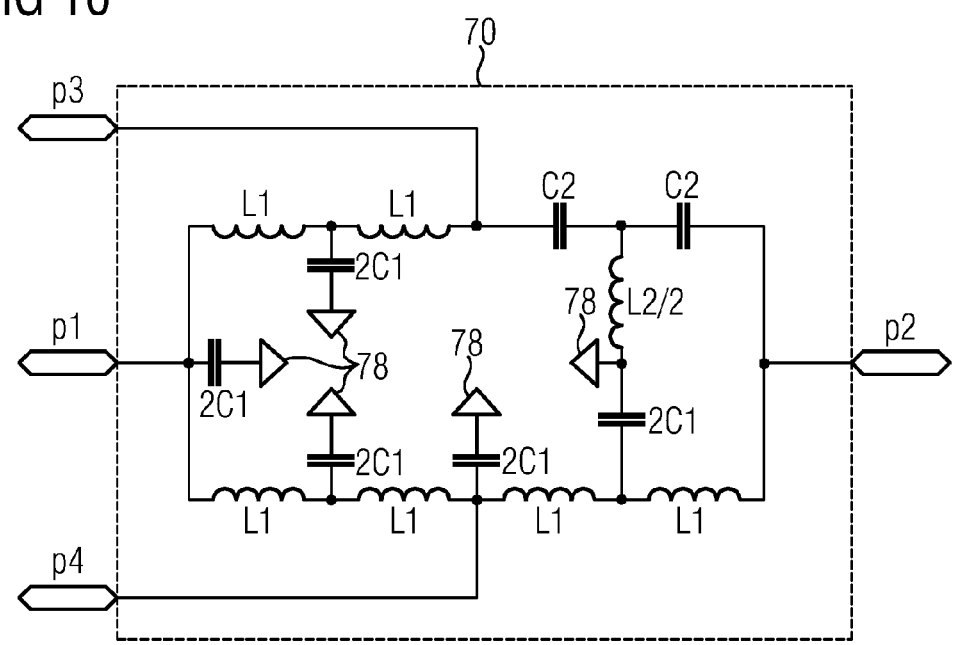
FIG. 10 depicts a schematic circuit diagram of a configuration of a directional coupler as depicted in FIG. 9, but with reduced component parts.

When considering the circuit structure depicted in FIG. 9, further components may also be saved here. Taking into consideration the possibilities for simplification, as already discussed for deriving the exemplary embodiment depicted in FIG. 8, a directional coupler 70 as depicted in FIG. 10 may be derived. As a result, components may be saved. In the configuration depicted in FIG. 10, only two values are required for the capacitances, namely the values 2C1 and C2. The same applies to the inductance values for which only the inductance value for L1 and the inductance value L2/2 occurs. As a result, the implementability of the directional coupler 70 may be markedly simplified. For an operating frequency of 10 MHz and a characteristic impedance $Z_0$ of 50Ω, a value of 186.4 pF results for 2C1 and a value of 318.3 pF results for C2, for example. Correspondingly, an inductance of 796 nH is to be provided for the inductance L1 and 1.36 μH for the inductance L2/2.

The following illustrations depicted in FIGS. 11 to 16 illustrate, on the basis of numerical simulations, the properties of the directional couplers described herein in comparison with the prior art.

For improved illustration, the values at the ports with half the power are increased by a factor of 101 g(2)=3.01 dB in the figure (standardization to 0 dB).

In the case of a reciprocal n port, there is in total n/2 (n+1) different s parameters. By way of example, selected s parameter profiles are illustrated in the following figures.

Figure 11:
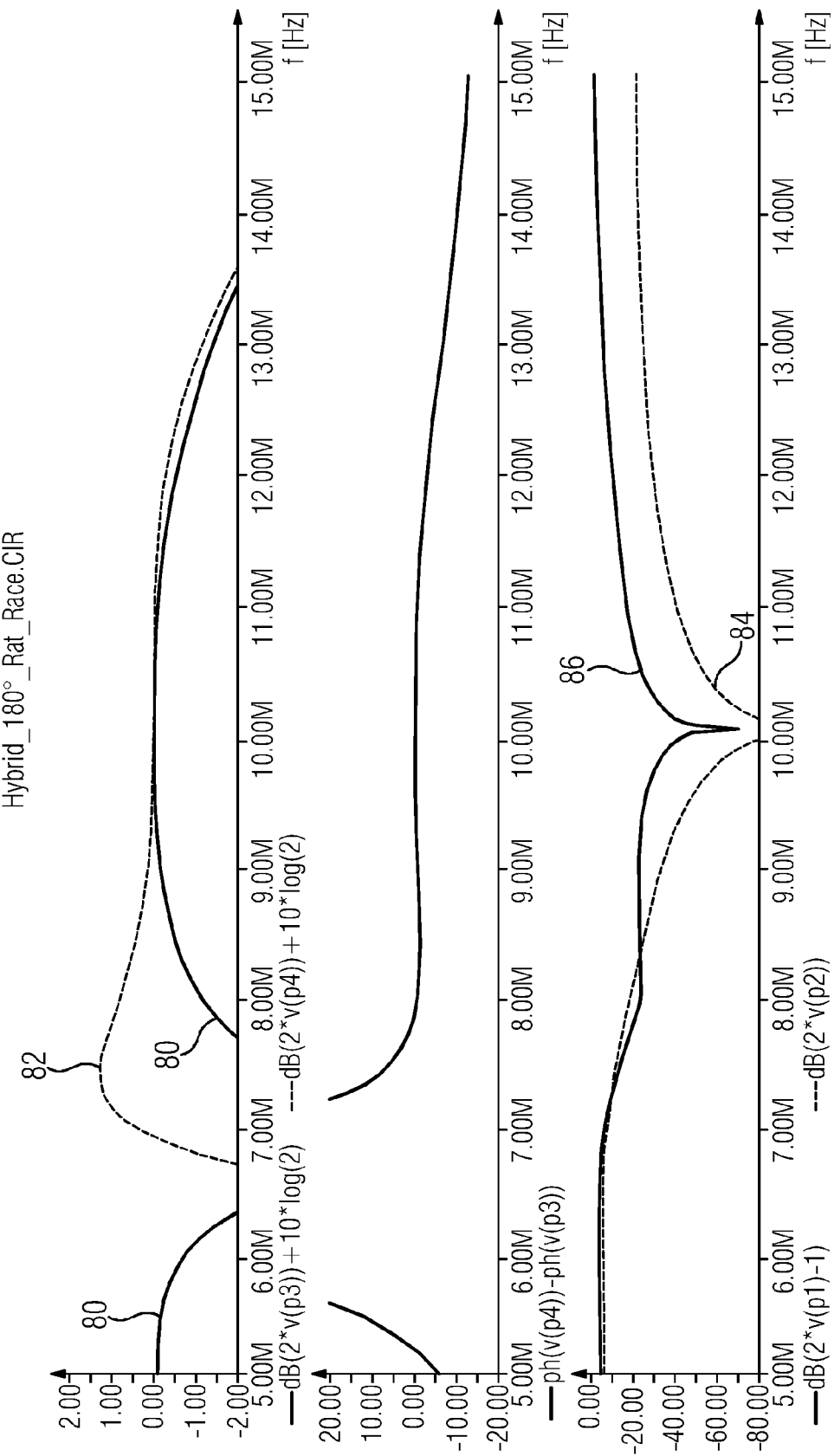
FIG. 11 depicts three graphs arranged one above the other schematic profiles illustrating the function of the directional coupler depicted in FIG. 2, wherein there was a feed-in at port 1.

FIG. 11 relates to the ring coupler 14 or the rat race coupler depicted in FIG. 2 with a feed into port P1. FIG. 11 depicts three graphs arranged one above the other, the x axes of said graphs being assigned to the frequency. In each case transmission and reflection damping or phase differences are plotted on the y axes.

A graph 80 at the top in FIG. 11 depicts the transmission normalized to 0 dB from port P1 to port P3. A graph 82 correspondingly indicates the transmission of the radiofrequency signal to port P4. The central graph depicts the phase difference in the radiofrequency signal between the two ports P3 and P4. The graph at the bottom illustrates the transmission to the decoupled port P2, to be precise by a graph 84. A graph 86 illustrates the matching at port P1. It may be seen that the desired function of the 180° hybrid is substantially only realized in a range of 5 MHz around an operating frequency of approximately 10 MHz. In the event of greater deviations from these operating frequencies, the desired function of the 180° hybrid decreases rapidly. The ring coupler 14 is therefore only suitable for narrow-band applications.

Figure 12:
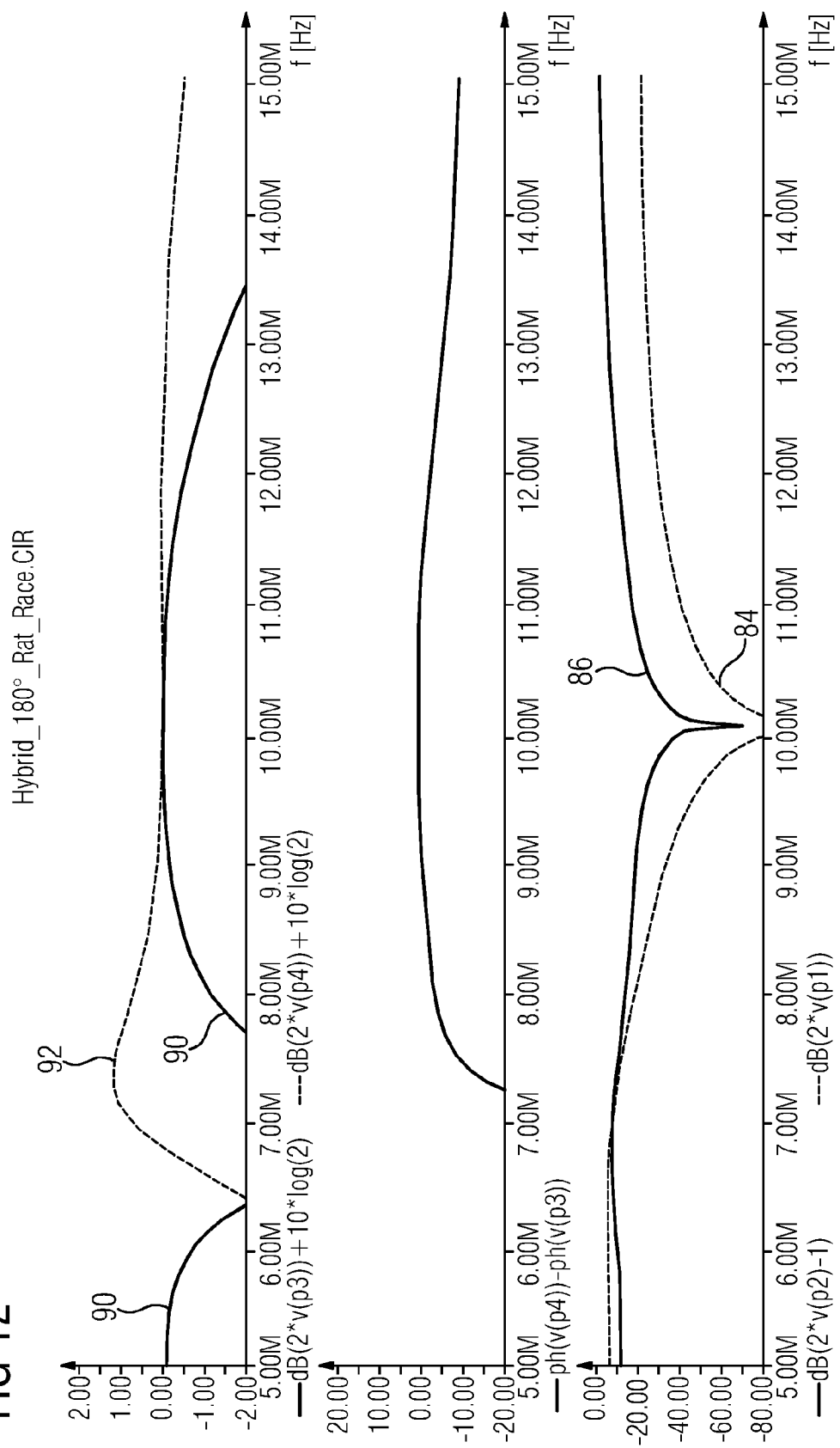
FIG. 12 depicts an illustration as depicted in FIG. 11, but with a feed-in at port 2, instead of at port 1.

FIG. 12 likewise depicts the properties for the case in which a feed into the port P2 now takes place instead of into the port P1 for the ring coupler 14 or the rat race coupler depicted in FIG. 2. The graphs are again as explained previously with respect to FIG. 11. At the top of FIG. 12, a graph 90 illustrates the transmission normalized to 0 dB to the fourth port P4 and a graph 92 illustrates the transmission normalized to 0 dB to the third port P3. The phase difference between the ports P3 and P4 is again illustrated in the central graph. The transmission to the decoupled port P1 is illustrated using a graph 84 at the bottom of FIG. 12, wherein the matching at the infeed port P2 is illustrated using a graph 86. It may be seen that the function of the 180° hybrid, as explained with respect to FIG. 11, is only provided in a frequency range with narrow limits of 5 MHz around 10 MHz.

Figure 13:
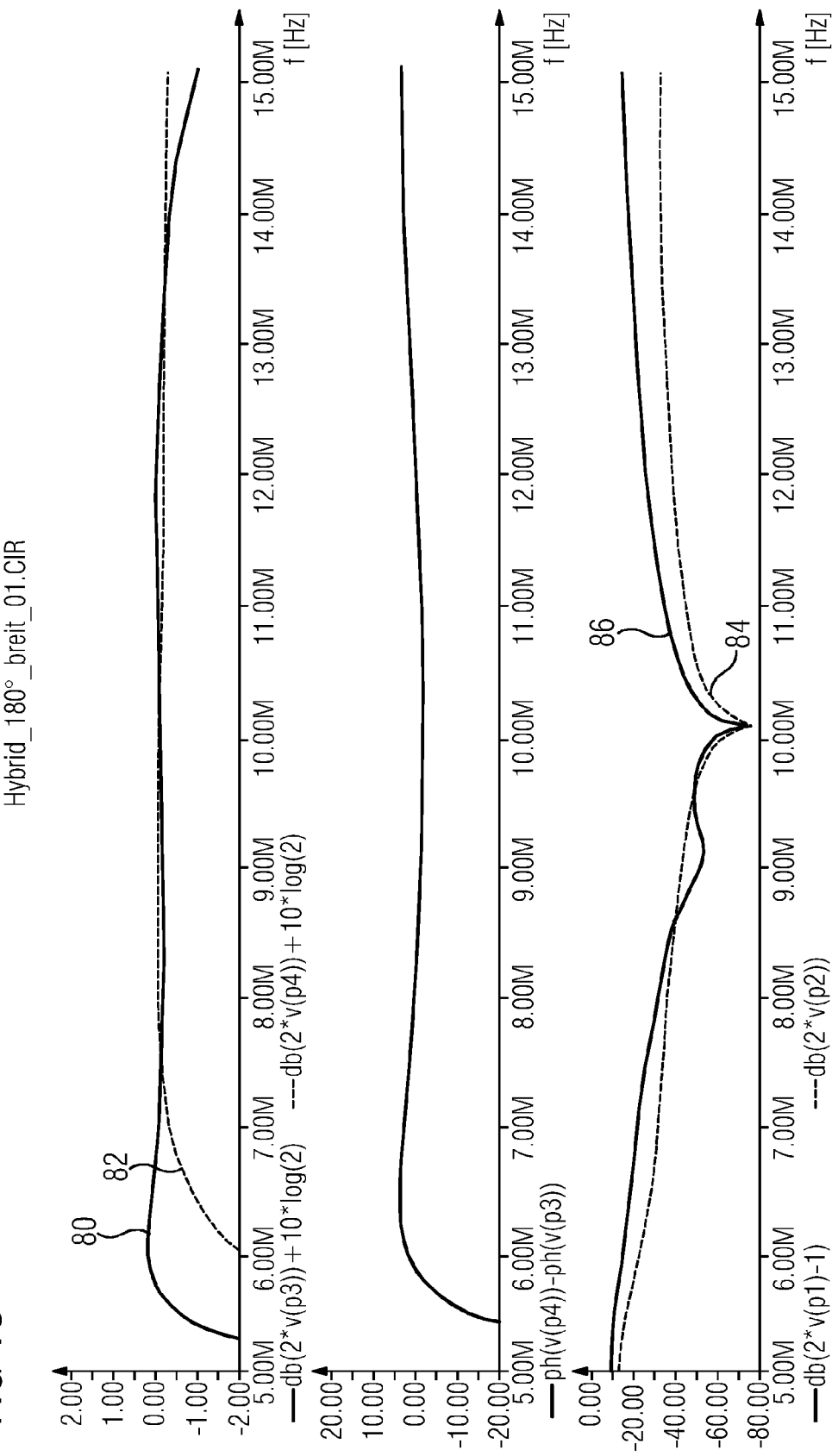
FIG. 13 depicts three graphs arranged one above the other which schematically illustrate the properties of a directional coupler as depicted in FIG. 9, wherein a feed-in takes place at port 1.

FIG. 13 now depicts an illustration as in FIG. 11 for a directional coupler 60 as depicted in FIG. 9 with a feed-in at port P1. The graphs in FIG. 13 correspond to the graphs in FIG. 11 in respect of the assignment. It may be seen that the bandwidth is considerably widened with respect to the ring coupler 14 or the rat race coupler depicted in FIG. 2 and the matching profile is substantially more constant. The same also applies to the phase shift depicted in the central graph. Correspondingly, advantages in accordance with the graph at the bottom with respect to transmission to the decoupled port P2 and matching at the port P1 likewise result.

Figure 14:
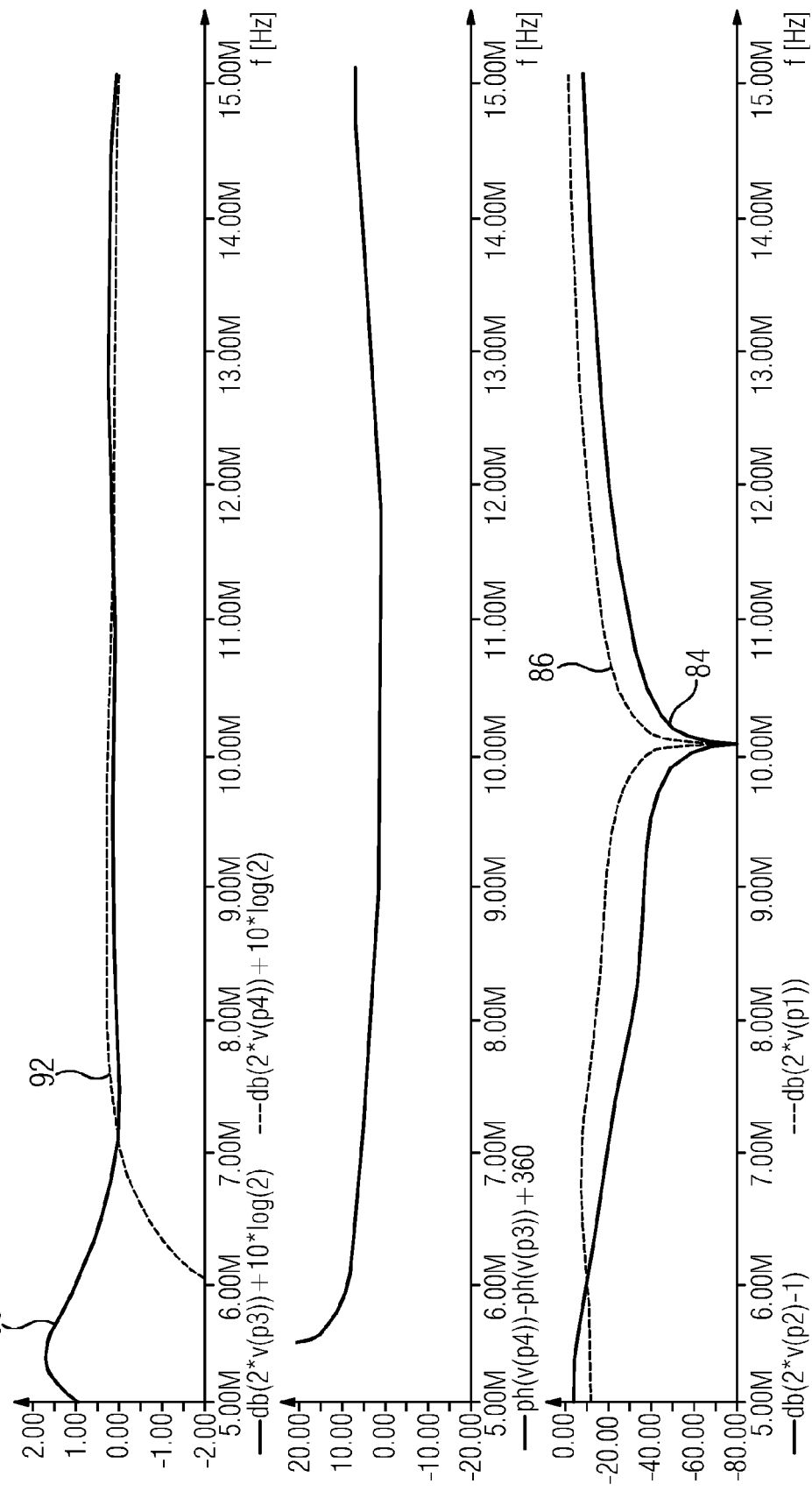
FIG. 14 depicts a schematic illustration of three graphs arranged one above the other as depicted in FIG. 13, but with a feed-in at port 2 instead of at port 1.

FIG. 14 depicts a corresponding illustration as in FIG. 12 using the circuit from FIG. 9, but with a feed into the port P2. The signal profiles may again be compared with one another directly. In this case too, a considerably wider bandwidth of the directional coupler results in respect of the phase difference between the output signals present at the third and fourth ports P3, P4. Equally, the behavior in relation to the decoupled port P1 and the matching at the port P2 at which there is a feed-in is improved. Overall, with the directional coupler 60 depicted in FIG. 9, a function of the 180° hybrid with a substantially wider bandwidth may be achieved in comparison with the prior art.

Figure 15:
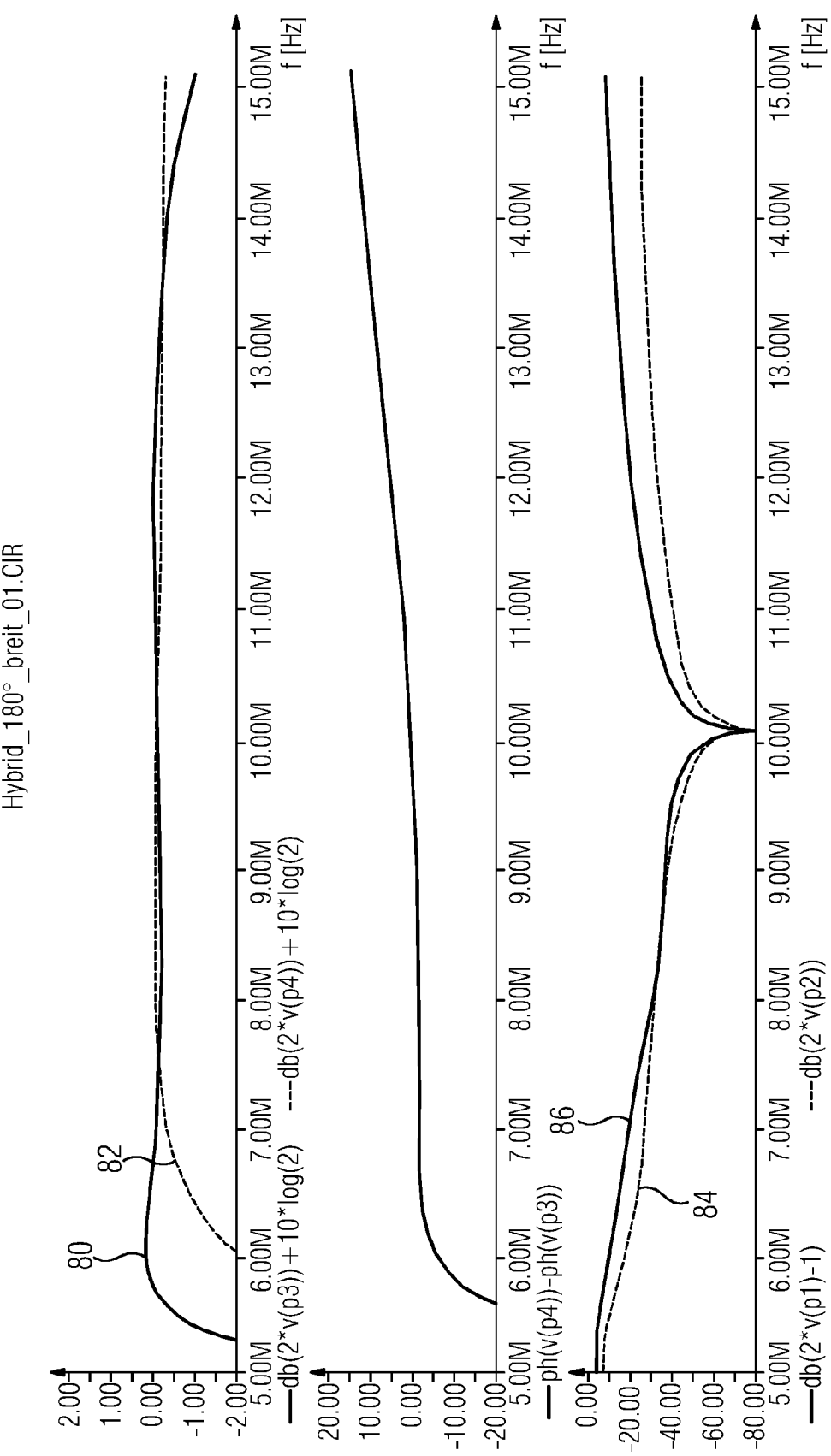
FIG. 15 depicts an illustration of three graphs arranged one above the other as depicted in FIG. 13, but with a feed-in at port 1 for a directional coupler as depicted in FIG. 10.
Figure 16:
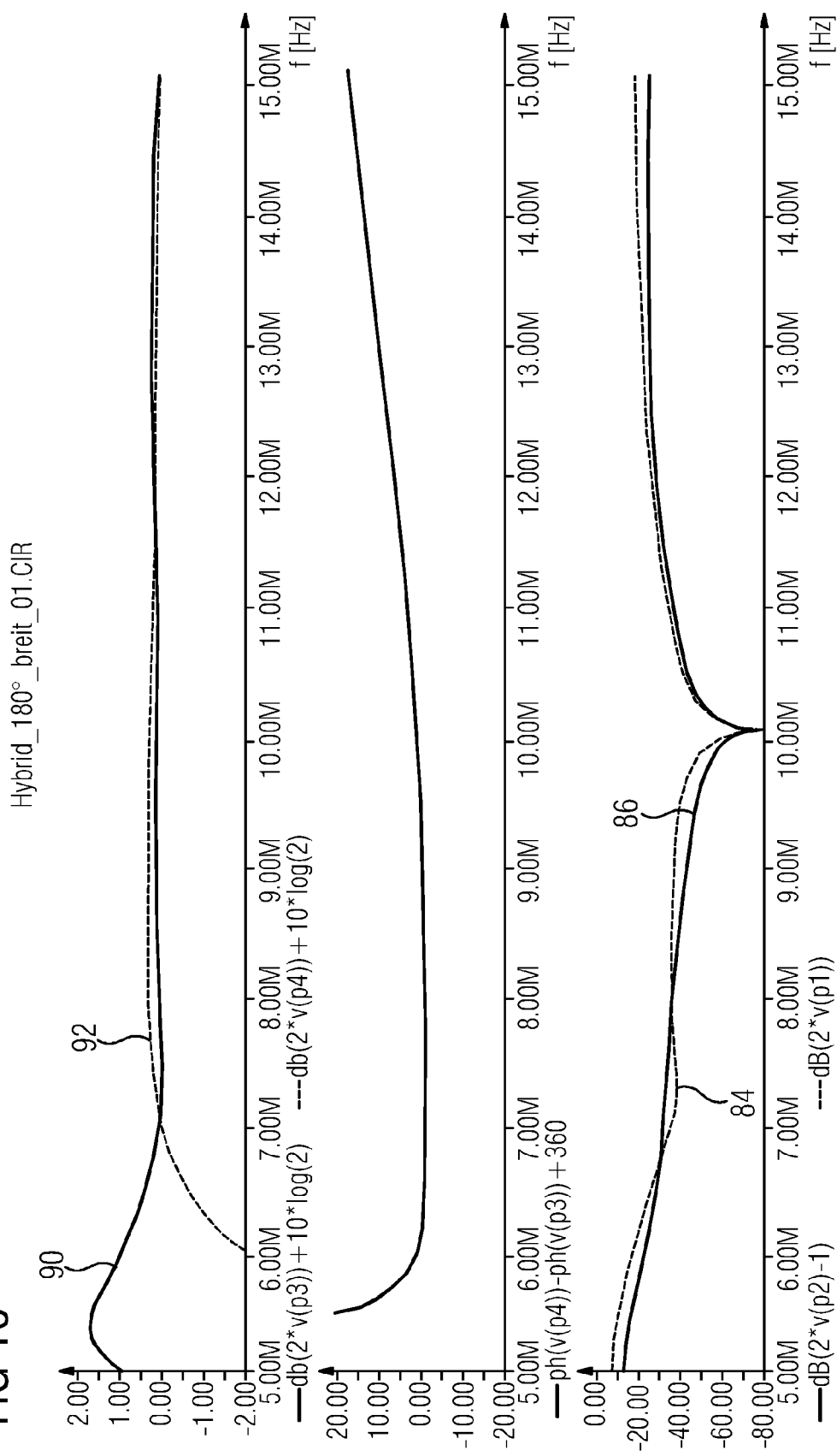
FIG. 16 depicts a schematic illustration of three graphs arranged one above the other for a directional coupler as depicted in FIG. 10 as in FIG. 15, but with a feed-in at port 2 instead of at port 1.

FIGS. 15 and 16 relate to the directional coupler 70 depicted in FIG. 10 and are intended to indicate the effects in particular in respect of the directional coupler 60 depicted in FIG. 9. Correspondingly, FIG. 15 depicts the behavior in the case of a feed into the port P1 of the directional coupler 70 as depicted in FIG. 10. The assignment of the graphs in turn corresponds to that in FIG. 13.

Although the directional coupler 70 has much fewer components than the directional coupler 60, it has substantially the same properties as the directional coupler 60. This additionally also supports a comparison between FIGS. 14 and 16, wherein FIG. 16 depicts the feed-in at port P2. In this case too, the graphs again are assigned correspondingly such that a direct comparison with FIG. 14 is possible. In this case too, the differences are marginal.

Overall, it may be seen that the directional couplers, in particular the directional couplers depicted in FIGS. 9 and 10, additionally require only few components in comparison with the prior art and here in particular in comparison with the ring coupler 14 or the rat race coupler depicted in FIG. 2 but need to have a considerably greater bandwidth of at least one octave for this.

The abovementioned exemplary embodiments serve merely to explain the invention and are not restrictive in respect of the invention. Inductances and capacitances may also be formed by line sections or combined with line sections. Furthermore, it is also possible for strip conductors or the like to be provided.

Finally, features from the claims and the description may be combined with one another in virtually any desired manner in order to arrive at further configurations within the meaning of the invention. In particular, apparatus features may also be realized by corresponding method acts, and vice versa.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A directional coupler having in each case one connection for a first port, a second port, a third port, and a fourth port, the directional coupler comprising:
    a first coupling network for providing a first port connection for the first port; and
    a second coupling network for providing a second port connection for the second port,
    wherein the first coupling network and the second coupling network are both connected to a third port connection for the third port and a fourth port connection for the fourth port,
    wherein the second coupling network comprises a first inductance connected between the third port and an electrical reference potential, a first capacitance connected between the fourth port and the electrical reference potential, a second capacitance connected between the third port and the second port, and a second inductance connected between the fourth port and the second port.

2. The directional coupler as claimed in claim 1, wherein the directional coupler is configured such that, when a first or second port input signal is fed in at the first port connection or the second port connection, the input signal does not provide a first or second port output signal at the respective other connection for the first or the second port, but provides third and fourth port output signals at the third port connection and the fourth port connection such that the third and fourth port output signals are shifted through 0° or 180° with respect to one another in terms of their relative phase angle, and when a third or fourth port input signal is fed in at the third port connection or the fourth port connection, the third or fourth port input signal does not provide a third or fourth output signal at the respective other connection for the third or the fourth port, but provides first and second port output signals at the first port connection and the second port connection such that the first and second port output signals are shifted through 0° or 180° with respect to one another in terms of their relative phase angle.

3. The directional coupler as claimed in claim 2, wherein the first and second coupling networks are connected in parallel to the third port connection for the third port and the fourth port connection for the fourth port.

4. The directional coupler as claimed in claim 3, wherein the first coupling network comprises an autotransformer connected to the third port connection and the fourth port connection, and a center connection that provides the first port connection for the first port via a matching network.

5. The directional coupler as claimed in claim 4, wherein the autotransformer comprises a bifilar winding.

6. The directional coupler as claimed in claim 4, wherein the matching network comprises a matching inductance connected between the first port connection for the first port and the center connection of the autotransformer, and a matching capacitance between the first port connection for the first port and the electrical reference potential.

7. The directional coupler as claimed in claim 4, wherein the matching network comprises a matching capacitance connected between the first port connection for the first port and the center connection of the autotransformer, and a matching inductance between the first port connection for the first port and the electrical reference potential.

8. The directional coupler as claimed in claim 4, wherein the first coupling network comprises two capacitances connected between the electrical reference potential and in each case one of the third and fourth ports, two inductances connected between the first port and in each case one of the third and fourth ports, and a capacitance connected between the first port and the electrical reference potential.

9. The directional coupler as claimed in claim 8, wherein one or more of the first coupling network, the second coupling network, or parts of the first or second coupling network comprise a multi-stage design.

10. The directional coupler as claimed in claim 9, wherein the directional coupler is in a form of a 180° hybrid.

11. The directional coupler as claimed in claim 1, wherein the first and second coupling networks are connected in parallel to the third port connection for the third port and the fourth port connection for the fourth port.

12. The directional coupler as claimed in claim 1, wherein the first coupling network comprises an autotransformer connected to the third port connection and the fourth port connection, and a center connection that provides the first port connection for the first port via a matching network.

13. The directional coupler as claimed in claim 12, wherein the autotransformer comprises a bifilar winding.

14. The directional coupler as claimed in claim 12, wherein the matching network comprises a matching inductance connected between the first port connection for the first port and the center connection of the autotransformer, and a matching capacitance between the first port connection for the first port and the electrical reference potential.

15. The directional coupler as claimed in claim 12, wherein the matching network comprises a matching capacitance connected between the first port connection for the first port and the center connection of the autotransformer, and a matching inductance between the first port connection for the first port and the reference potential.

16. The directional coupler as claimed in claim 1, wherein the first coupling network comprises two capacitances connected between the electrical reference potential and in each case one of the third and fourth ports, two inductances connected between the first port and in each case one of the third and fourth ports, and a capacitance connected between the first port and the electrical reference potential.

17. The directional coupler as claimed in claim 1, wherein one or more of the first coupling network, the second coupling network, or parts of the first or second coupling network comprise a multi-stage design.

18. The directional coupler as claimed in claim 1, wherein the directional coupler is in a form of a 180° hybrid.

19. A magnetic resonance tomography device comprising:
   electrical transmission coils arranged in a housing providing a ring-shaped space;
   a radiofrequency generator applying radiofrequency electric power to the electrical transmission coils and comprising reception coils; and
   a directional coupler comprising:
      a first coupling network for providing a first port connection for the first port; and
      a second coupling network for providing a second port connection for the second port,
      wherein the first coupling network and the second coupling network are both connected to a third port connection for the third port and a fourth port connection for the fourth port,
      wherein the second coupling network comprises a first inductance connected between the third port and an electrical reference potential, a first capacitance connected between the fourth port and the electrical reference potential, a second capacitance connected between the third port and the second port, and a second inductance connected between the fourth port and the second port.

* * * * *